United States Patent
Ooae et al.

(10) Patent No.: US 6,509,568 B1
(45) Date of Patent: Jan. 21, 2003

(54) ELECTROSTATIC DEFLECTOR FOR ELECTRON BEAM EXPOSURE APPARATUS

(75) Inventors: Yoshihisa Ooae, Tokyo (JP); Hitoshi Tanaka, Tokyo (JP); Takeshi Haraguchi, Tokyo (JP); Kazuto Ashiwara, Tokyo (JP); Tomohiko Abe, Tokyo (JP); Ryoji Kato, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/431,441

(22) Filed: Nov. 1, 1999

(30) Foreign Application Priority Data

Nov. 2, 1998 (JP) .......................... 10-311945
Feb. 2, 1999 (JP) .......................... 11-024947

(51) Int. Cl.$^7$ ................................. H01J 3/38
(52) U.S. Cl. ................................. 250/396 R
(58) Field of Search .................. 250/396 R, 400, 250/396 ML, 398, 310

(56) References Cited

U.S. PATENT DOCUMENTS

| | | | |
|---|---|---|---|
| 3,598,957 A | | 8/1971 | Yasuda |
| 4,525,629 A | | 6/1985 | Morita et al. ............... 250/396 |
| 4,661,709 A | * | 4/1987 | Walker et al. ........... 250/396 R |
| 4,897,290 A | | 1/1990 | Terasaka et al. |
| 5,117,117 A | * | 5/1992 | Oae et al. ................. 250/492.2 |
| 5,324,362 A | | 6/1994 | Schneider et al. |
| 5,571,332 A | | 11/1996 | Halpern |
| 5,719,402 A | * | 2/1998 | Satoh et al. ......... 250/396 ML |
| 5,770,862 A | | 6/1998 | Ooaeh et al. ................. 250/398 |
| 5,929,452 A | | 7/1999 | Yoshitake et al. |
| 6,055,719 A | * | 5/2000 | Ooaeh et al. ............... 29/592.1 |
| 6,125,522 A | * | 10/2000 | Nakasuji ...................... 29/458 |
| 6,181,048 B1 | | 1/2001 | Smith et al. |

FOREIGN PATENT DOCUMENTS

| | | |
|---|---|---|
| JP | 7-224382 | 8/1995 |
| JP | 11-229142 | 8/1999 |

* cited by examiner

Primary Examiner—John R. Lee
Assistant Examiner—Anthony Quash
(74) Attorney, Agent, or Firm—Christie, Parker & Hale, LLP

(57) ABSTRACT

An electron beam radiation apparatus having an electrostatic deflector capable of deflecting the electron beam with high accuracy and with a reduced displacement of the deflection position, is disclosed. The electrostatic deflector comprises a cylindrical holding member made of an insulating material and a plurality of electrodes separately fixed from each other inside of the holding member with at least a part of the surface thereof covered with a metal film. The holding member has a plurality of wedge-shaped fixing holes corresponding to the portions of the electrodes where they are fixed, respectively, the holes having a larger diameter on the outer peripheral surface than on the inner peripheral surface of the holding member. The electrodes are fixed on the holding member in such a manner that a molten joining metal is injected in the fixing holes with the electrodes arranged on the holding member and the joining metal is hardened in close contact with the metal film of the electrodes. The electrodes fixed on the holding member are so shaped that the inner wall of the holding member is invisible from the cylinder axis of the holding member. The electrodes have a metal thin film formed, by vapor deposition, on the inner wall surface of the electrodes after being fixed on the holding member.

8 Claims, 7 Drawing Sheets

Ei (i=1~8)

Ei

ELECTROSTATIC DEFLECTOR FOR ELECTRON BEAM EXPOSURE APPARATUS

BACKGROUND OF THE INVENTION

The present invention relates to an electrostatic deflector used for deflecting an electron beam in an electron beam radiation apparatus such as an electron beam exposure apparatus or an electron microscope.

An electron beam can be reduced to several tens of nm in diameter, and apparatuses for radiating an electron beam such as an electron microscope or an electron beam exposure apparatus are used. These electron beam radiation apparatuses use a deflector for changing the exposure position of the electron beam converged on a sample. The deflector used for this purpose includes an electromagnetic deflector having a large deflection range but a comparatively low response rate or an electrostatic deflector having a narrow deflection range but a high response rate or a combination thereof. The present invention relates to an electrostatic deflector. Although the description that follows refers to the electrostatic deflector of the electron beam exposure apparatus, as an example, the present invention is not limited to such a deflector but is applicable to any electrostatic deflector used with an electron beam radiation apparatus.

In recent years, the ever-increasing miniaturization and density of integrated circuits has developed to such an extent that a further miniaturization is difficult to achieve by the photolithography which has long been a main stay of techniques for forming a fine pattern. In view of this, an exposure method using a charged particle beam such as an electron beam or an ion beam or a new exposure method using X rays have been studied and realized as a technique replacing the photolithography. Of all these methods, electron beam exposure, which can form a pattern as fine as not more than 0.1 μm using an electron beam is in the spotlight. At the same time, the electron beam exposure apparatus is required to have an operating stability, a high throughput and a finer micromachinability as a part of a semiconductor mass production system.

A typical conventional electron beam exposure apparatus employs deflection means configured with a combination of an electromagnetic deflector and an electrostatic deflector. The electromagnetic deflector is called a main deflector, and the electrostatic deflector an auxiliary deflector. Generally, the deflection range (main deflection range) of the electromagnetic deflector is divided into several areas (subdeflection range) each smaller than the deflection range of the electrostatic deflector, the deflection position of the electromagnetic deflector is located at the center of each subdeflection range, and each subdeflection range is deflected by the electrostatic deflector. A projection lens for radiating an electron beam of an appropriate section on a wafer is built into the column of the electron beam exposure apparatus. The electromagnetic deflector and the electrostatic deflector are arranged substantially integrally with the projection lens, or specifically, the electrostatic deflector is housed in the electromagnetic deflector.

The use of a metal of a superior machinability and high precision but of a high conductivity for the electrostatic deflector (auxiliary deflector) or the surrounding parts leads to the inconvenience of a lower response rate of the electromagnetic deflector (main deflector) due to an eddy current. This poses a serious problem for the electron beam exposure apparatus requiring a high throughput.

In an attempt to reduce the eddy current, an electrostatic deflector has been formed by plating (for example, with Ni and Au as a base and a surface, respectively) the interior of a cylindrical insulating material (such as alumina). To avoid the problems of the machining precision and the difficulty of the plating process, however, the current practice is to make an electrostatic deflection electrode by grinding an AlTiC (compound of alumina and titanium carbide) ceramic having an almost ideal resistivity and plating it with platinum, which electrode is fixed in a hollow cylinder of an insulative alumina ceramic to make an electrostatic deflector.

FIGS. 1A to 1C show a conventional electrostatic deflector of an electron beam exposure apparatus. FIG. 1A shows an outer configuration of the electrostatic deflector, FIG. 1B a top plan view as taken in line 1B–1B' in FIG. 1A, and FIG. 1C a sectional view taken in line 1C–1C' in FIG. 1B.

The electrostatic deflector 10 shown in the diagrams is arranged in an electromagnetic deflector constituting a main deflector (not shown) and used as an auxiliary deflector of an electron beam exposure apparatus. As shown, the electrostatic deflector 10 includes a group of electrodes 11, and a hollow cylindrical holding member 12 with the electrodes 11 fixed therein.

The electrodes 11 are composed of eight AlTiC ceramic electrode members $E_1$ to $E_8$. The electrode members $E_1$ (i: 1 to 8) are fixedly arranged symmetrically about an axis in the holding member 12 (FIG. 1B). Each electrode members $E_1$ is ground into the same shape with the surface formed of a metal film. This metal film is made of a metal of platinum group such as ruthenium (Ru), rhodium (Rh), palladium (Pd), osmium (Os), iridium (Ir) or platinum (Pt) and formed directly on each surface of the conductive ceramics by electroplating.

The electron beam is a flow of electrons, which when impinged on an insulating material, accumulates the electric charge on the surface of the insulating material. The electric charge thus accumulated has an effect on the surrounding electric field. The electrostatic deflector is for generating an electric field in the electrodes 11 by applying a voltage to each electrode member $E_1$ and deflecting the incident electron beam with the force of the electric field. The problem is that in the case where the electric field is disturbed by the charge accumulated on the surface of the surrounding holding member 12, the desired deflection amount cannot be obtained. In view of this, the conventional electrostatic deflector shown in FIGS. 1A to 1C has a structure in which each electrode member Ei has a crank-shaped section so that the inner surface of the holding member 12 is not directly visible from the center axis of the cylinder. With this shape, even when the electron beam is disturbed as it passes through the cylinder, the electrons disturbed impinge on one of the electrode members Ei and are prevented from reaching the inner surface of the holding member 12.

On the other hand, the holding member 12 is required to insulate the electrode members $E_i$ from each other and is made of a ceramic insulating material such as alumina. This holding member 12 is formed with wedge-shaped fixing holes 31 having a larger diameter on the outer peripheral surface than on the inner peripheral surface of the holding member 12. These fixing holes are used for fixing the electrodes 11 (eight electrode members $E_1$ to $E_8$) inside, and two fixing holes (for a total of 16) are formed for each electrode member $E_i$. The inner wall portion of each fixing hole 31 is formed with joining metal pads 16, 17 made of Ti or molybdenum-manganese (Mo—Mn), as a main component, by metallization.

FIG. 2A shows an electrode member $E_i$ making up the electrodes, and FIG. 2B a sectional view of the electrode member $E_i$ and the holding member on which the electrode member $E_i$ is fixed.

Eight electrode members Ei of the same shape are used for constituting the electrodes 11 of the electrostatic deflector and are made by grinding the AlTiC ceramics and plating the surface with platinum. For fabricating the electrode members $E_i$, the first step is to grind them into the same shape. Each electrode member $E_i$, after the surface thereof is cleaned, is formed with a conductive metal pad 13 by metallization with titanium (Ti), as a main component, constituting a part impressed with a voltage from the driver. Further, joining metal pads 14, 15 of Ti, as a main component, are formed by metallization at two arbitrary points for fixing the electrode member $E_i$ to the holding member 12. The size of each of the metal pads 13 to 15 is kept to a minimum. Then, platinum (Pt) is directly formed on the surface of each electrode member $E_i$ by electroplating to the thickness of not more than 2 $\mu$m.

Each electrode member $E_i$, to be fixedly arranged in the holding member 12, is inserted into the holding member 12 while being fixedly set in position with high accuracy by an assembly jig, and a small amount of the molten metal solder material 18 is injected and hardened in the fixing holes 31 formed in the holding member 12 (FIG. 2B). As a result, the joining metal pads 14, 15 formed on the electrode member $E_i$ and the joining metal pads 16, 17 formed on the holding member 12 are fixed through a joining metal 18. In other words, each electrode member $E_i$ is firmly fixed in a predetermined relative position. Instead of injecting the joining metal 18 in the fixing hole 31, an adhesive may be used.

The electrostatic deflector of the conventional electron beam exposure apparatus has the configuration described above. In actual practice, however, the deflection position is displaced, though to a small degree, by about several tens of nm. Even this slight displacement has appeared as a problem in recent years as a finer and finer resolution has been required of the electron beam exposure apparatus.

SUMMARY OF THE INVENTION

The object of the present invention is to realize an electrostatic deflector higher in accuracy than the electron beam radiation apparatus described above by reducing the displacement of the deflection position thereof.

In order to achieve the object described above, according to the first aspect of the present invention, there is provided an electrostatic deflector of an electron beam radiation apparatus, wherein a plurality of electrodes are fixed separately from each other on the inside of a cylindrical holding member made of an insulating material, and a metal thin film is deposited by evaporation on the inner wall surface of the electrodes, as shown in FIGS. 1A to 1C.

Specifically, an electrostatic deflector of an electron beam radiation apparatus according to the first aspect of the invention comprises a cylindrical holding member made of an insulating material and a plurality of electrodes fixed in spaced relation with each other on the inside of the holding member and having at least a part of the surface thereof grown with a metal film, wherein the holding member has a plurality of wedge-shaped fixing holes formed in positions corresponding to the positions where the electrodes are fixed, the fixing holes have a larger diameter on the outer peripheral side than on the inner peripheral side of the holding member, the electrodes are arranged and fixed on the holding member by injecting a molten joining metal into the fixing holes, the joining metal is hardened in close contact with the metal film, the inner wall surface of the holding member is invisible from the cylinder axis of the holding member with the electrodes fixed on the holding member, and the electrodes have a metal thin film formed by evaporation on the inner wall surface of the electrodes after fixing the electrodes on the holding member.

After the assembly, the metal thin film is formed on the inner wall surface of the electrodes by vapor deposition in such a manner that the holding member is held in vacuum and while being rotated, the vapor source constituting the material of the metal thin film is heated while moving it in the holding member.

FIGS. 3A to 3C are diagrams showing basic structures of electrostatic deflectors for an electron beam radiation apparatus according to a second aspect of the invention, in which FIG. 3A shows a first basic structure, FIG. 3B a second basic structure and FIG. 3C a third basic structure.

As shown in FIGS. 3A to 3C, the electrostatic deflectors for an electron beam radiation apparatus according to the second aspect of the invention comprises a cylindrical holding member 52 made of a non-conductive material and a plurality of electrodes 11 having at least a partially conductive surface and fixedly separate from each other along the inner peripheral direction. In the first basic structure of the electrostatic deflector according to the invention, as shown in FIG. 3A, the holding member 52 has, in the portions thereof facing the space between each adjacent electrodes, openings 60 in the direction parallel to the axis of the cylinder. In the second basic structure according to the invention, as shown in FIG. 3B, on the other hand, a plurality of the electrodes 11 extend in the direction of emission of the electron beam from the holding member 52. In the third basic structure according the invention, as shown in FIG. 3C, the holding member has a plurality of independent holding units 52a, 52b the total length of which is sufficiently smaller than the length of the electrode 11.

Various analyses show that the displacement of the deflection position is probably caused by the charge-up of the electrostatic deflector. Before assembly of the electrostatic deflection shown in FIGS. 1A to 1C, the electrode members and the holding member are cleaned into a state apparently completely free of fouling and the assembly work is conducted in the clean environment. In fact, a check of the state of the inner wall surface of the electrode members after assembly has not revealed any fouling according to the state-of-the-art detection method. Nevertheless, the present inventor has estimated that a fouling that cannot be detected may have caused the charge-up. As described above, the electrostatic deflector shown in FIGS. 1A to 1C is fabricated by forming a metal (platinum) film on the surface of the electrode members by plating or by vapor deposition, followed by fixing the electrode members on the holding member with a joining metal. In the case where a metal solder is used as the joining metal, the flux contained in the metal solder attaches, taking a circuitous route, to the inner wall surface of the electrode at the time of heating. Also, when an adhesive is used in place of the joining metal, an organic material may attach or the adhesive may ooze out on the inner wall surface of the electrodes at the time of heating. Further, the surface of the metal film formed by plating comes into contact with a liquid with many chemical substances dissolved therein during the plating process. Even after the post-plating cleaning, therefore, some residue is expected to remain on the surface. According to the state of the art, such fouling cannot be detected but may have caused a small charge-up leading to the displacement of the deflection position.

The present inventor thought that this fouling was unavoidably caused during the assembly process and that the charge-up can be avoided by forming a new metal thin film covering the fouling. The structure of the electrostatic deflector in which, as shown in FIGS. 1A to 1C, the electrodes are fixed on the inner wall surface of an elongate cylinder, however, precludes the use of the sputtering for forming a metal thin film on the inner wall surface of the electrodes. In view of this, the holding member with the electrodes fixed thereon is held in vacuum, a wire member constituting the material of the metal thin film is held on the cylinder axis of the holding member, and rotating the holding member, the wire member is moved while being heated in the holding member.

In this way, a metal thin film is formed on the inner wall surface of the electrodes by vacuum deposition with the wire member as a vapor source. In vacuum deposition, the temperature of the holding member with the electrode members fixed thereon increases, and the electrode members are required to be fixed with a metal. In this case, therefore, a bonding method having a low heat resistance cannot be used. The metal thin film formed on the inner wall surface of the electrodes is not exposed to the mechanical force and therefore is not required to be a mechanically strong film. Further, the electrode members are a crank-shaped as shown in FIGS. 1A, 1B. Therefore, the material evaporated from the wire member arranged on the cylinder axis proceeds straight ahead and attaches to the inner wall surface of the electrode members but not to the inner wall surface of the holding member. As a consequence, the insulation between the electrodes is not adversely affected.

In fact, the displacement of the deflection position can be avoided by forming a metal thin film on the inner wall surface of the electrode after assembly.

The present inventors have discovered that another cause of the charge up is the reflected electrons, the secondary electrons and the evaporated components of the sample attaching to the surface of the holding member. The charge up from this viewpoint will be explained with reference to FIG. 4.

In the electron beam exposure apparatus, the electrostatic deflector 10 is arranged at a position nearest to a sample (wafer) 1 in the electromagnetic deflector 9. The surface of the sample 1 is formed with a resist layer 2 and irradiated with an electron beam 3. The electron beam radiated on the resist layer 2 is absorbed into the resist layer 2 and sensitizes it, although part of the electron beam is reflected by the surface of the resist layer 2 and returns to the electrostatic deflector 10. Also, part of the secondary electrons scattered in the resistor layer 2 or absorbed into and released from the resist layer 2 also returns to the electrostatic deflector 10. These reflected electrons and the secondary electrons are accumulated at a position near the end of the holding member 12. Also, the electron beam 3 enters the sample 1 by being deflected while passing through the electrostatic deflector 10 and the electromagnetic deflector 9. In the case where the deflection amount is large, the electron beam 3 enters the sample at a position near to the surface of the extension of the electrode members $E_i$. The reflected electrons or the secondary electrons from this position, even though the electrode members $E_i$ are in the shape of crank as described above, are more liable to arrive at the surface of the holding member 12. The problem resulting from the fact mentioned above is that the charge is liable to be accumulated (charged up) especially at a portion of the holding member 12 nearer to the sample 1, thereby leading to an error of the exposure position of the electron beam.

The charge-up occurs also due to another cause. In the electron beam exposure apparatus, the interior of the column and the interior of the chamber coupled to the column for the exposure processing are normally kept in high vacuum state. Actually, however, due to the evaporation of the resist or the like, a compound (fouling) having burnt carbon as a main component is generated by the radiation of the electron beam. This fouling is not a good conductor, and therefore the charge-up occurs on the electrode surface, disturbs the electric field, and thus poses the problem of an error occurring at the exposure position of the electron beam. This problem is especially conspicuous on the electrostatic deflector (subdeflector) located in the neighborhood of the wafer coated with the resist.

In the prior art, the electrostatic deflector itself is replaced with a new one when the charge-up reaches a certain amount. The work of replacing the electrostatic deflector, however, requires the temporary loss of the high vacuum state (i.e. temporary exposure to the atmosphere) in the column and the chamber. During the restart-up of the exposure apparatus after the replacing work (during the initialization of the deflection data applied to each deflector, for example), the apparatus is stationary, thereby leading to a lower throughput. To cope with this problem, a method called the "in-situ" cleaning for removing the fouling without exposing the interior of the column and the chamber to the atmosphere has been used. In this method, a very small amount of a gas having oxygen as a main component is introduced into the apparatus, and in this thin gas atmosphere, a high-frequency power is applied to the electrostatic deflection electrode and thus an oxygen plasma is generated to remove the fouling by ashing. This "in-situ" cleaning, however, sputters the conductive substances forming a metal film on the electrode surface or a substance contaminating the electrode surface. These substances attach to the non-conductive surface of the holding member 12 and reduce the insulation resistance between the electrodes or otherwise cause the charge-up unexpectedly, resulting in a lower positional accuracy of exposure.

As shown in FIGS. 1A to 1C, a plurality of electrodes 11 are fixed on the interior of the holding member, and the interior of the cylinder directly faces the space between each adjoining electrodes. The charge is accumulated in these space between the electrodes, which affects the internal electric field of the cylinder. Also, the insulation resistance between the electrodes is affected by the surface resistance of the portion of the holding member corresponding to each space between the electrodes. As shown in FIG. 3A, with the first basic structure of the invention, a plurality of openings 60 extending in the direction parallel to the axis of the cylinder are formed in the portions of the holding member 52 corresponding to the space between the electrodes, and therefore the portion of the holding member 52 corresponding to the space between the electrodes is reduced. Thus, as compared with the prior art, the amount of the charge accumulated is reduced for a reduced effect on the electric field. Further, the area (width) of the portions of the holding member 52 corresponding to the space between the electrodes is reduced for an increased surface resistance. As a result, the insulation resistance between the electrodes increases to such an extent that even when a conductive substance or a contaminated substance attaches to the particular portion, the effect thereof can be reduced.

As described above, the problem is posed mainly in the case where a charge-up of the holding member occurs or a conductive substance or a contaminated substance attaches to the portion of the holding member nearer to the sample.

As shown in FIG. 3B, with the second basic structure according to the invention, a plurality of the electrodes 11 extend in the direction of electron beam emission from the holding member 52, which is located at a distance from the sample. Therefore, the charge-up or the attachment of the conductive or contaminated substance is difficult to occur. Incidentally, the holding member is desirably one third or more of the length of the electrode away from the sample.

As shown in FIG. 3C, the third basic structure according to the invention, like the first basic structure, is intended to reduce the area of the holding member 52 corresponding to the space between each adjoining electrodes. In the first and second basic structures, the holding member 52 has a predetermined shape, and a plurality of the electrodes 11 are arranged in predetermined relative positions by being fixed on the holding member 52. With the third basic structure, in contrast, the holding member is divided into a plurality of independent holding units 52a, 52b, which initially have no predetermined relative positions. In view of this, in the third basic structure, a plurality of the electrodes and a plurality of the holding units are fixed in position for determining the relative positions of a plurality of the electrodes. In other words, a plurality of the electrodes also function as a structural member to determine relative positions.

It is also possible to employ a combination of the first to third basic structures described above. Further, the first aspect of the invention can be applied to the second aspect, so that after assembling the electrostatic deflector having the third basic structure from the first structure, the deposition by evaporation is desirably effected on the electrode surface as in the first aspect.

BRIEF DESCRIPTION OF THE DRAWINGS

The features and advantages of the electron beam exposure apparatus according to the present invention will be more clearly understood from the following description taken in conjunction with the accompanying drawings, in which.

DESCRIPTION OF THE PREFERRED EMBODIMENTS

Figure 1B:
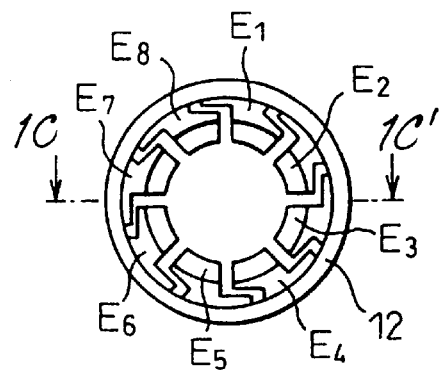
FIGS. 1A to 1C are model diagrams showing the appearance and an internal configuration of the electrostatic deflector of the conventional electron beam exposure apparatus.
Figure 1A:
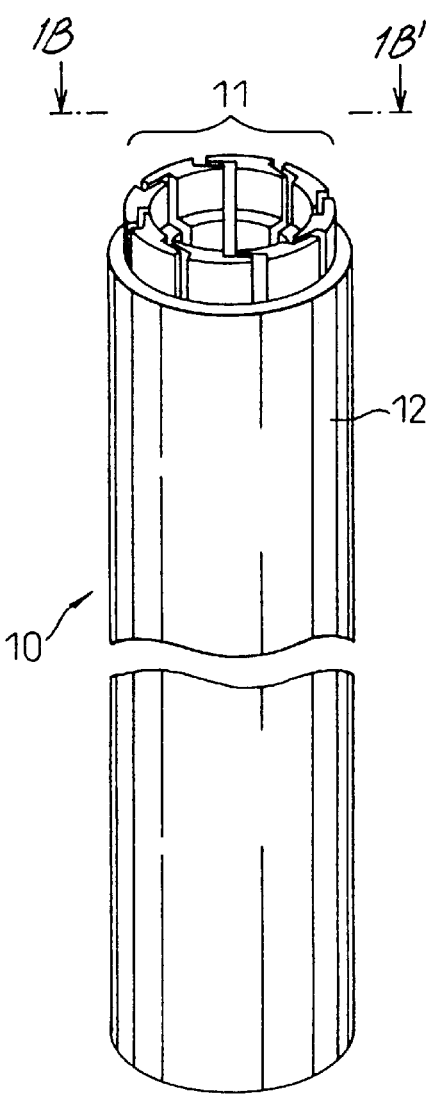
Figure 1C:
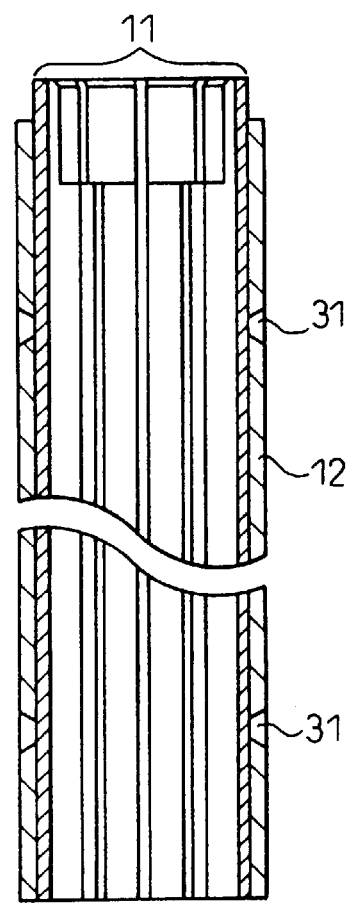
Figure 2A:
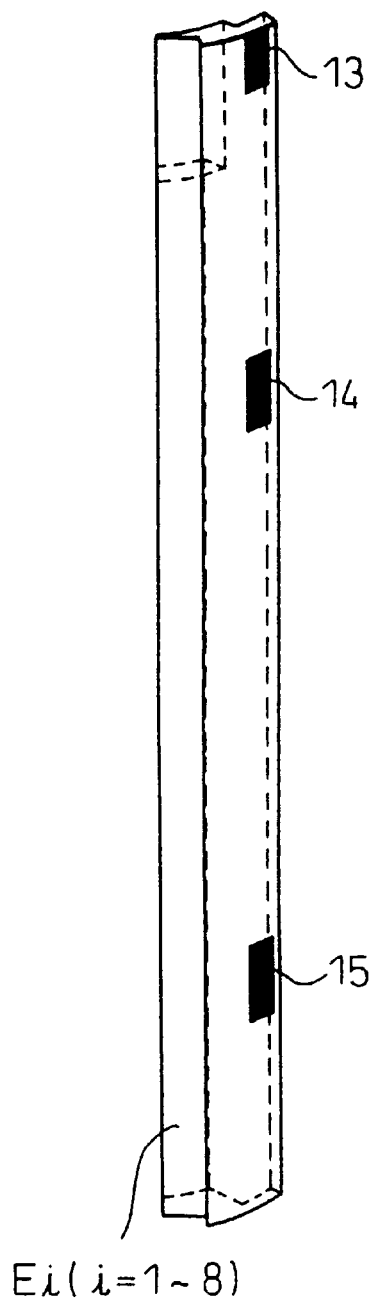
FIGS. 2A and 2B are diagrams showing the conventional electrode member and the state in which the electrode member is fixed on the holding member.
Figure 2B:
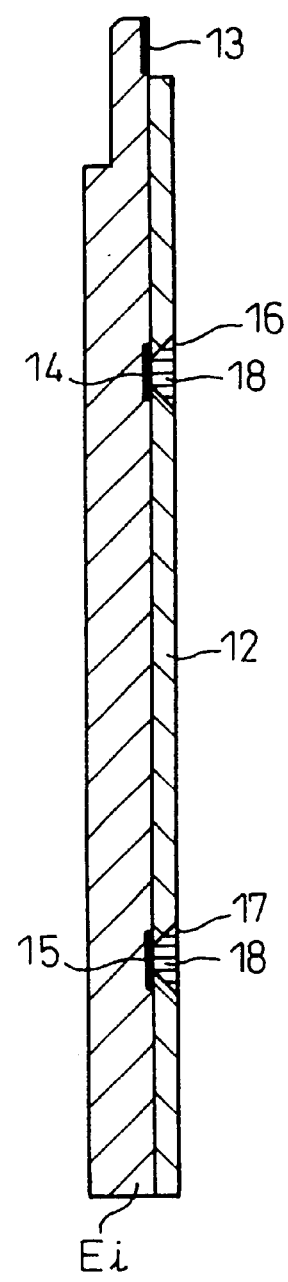
Figure 3C:
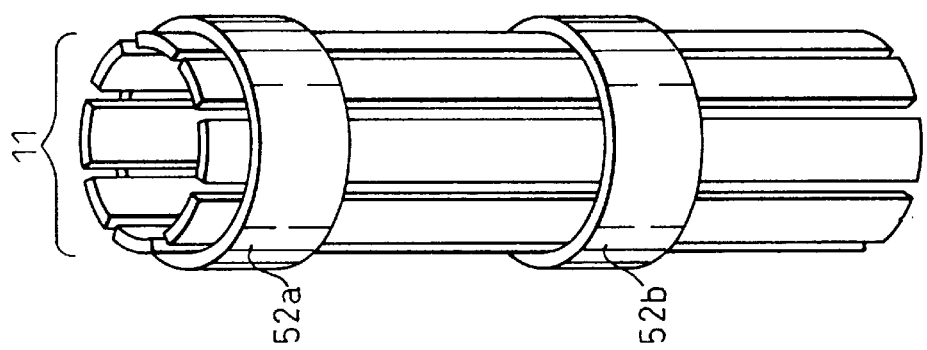
FIGS. 3A to 3C are diagrams showing basic structures of an electrostatic deflector according to this invention.
Figure 3B:
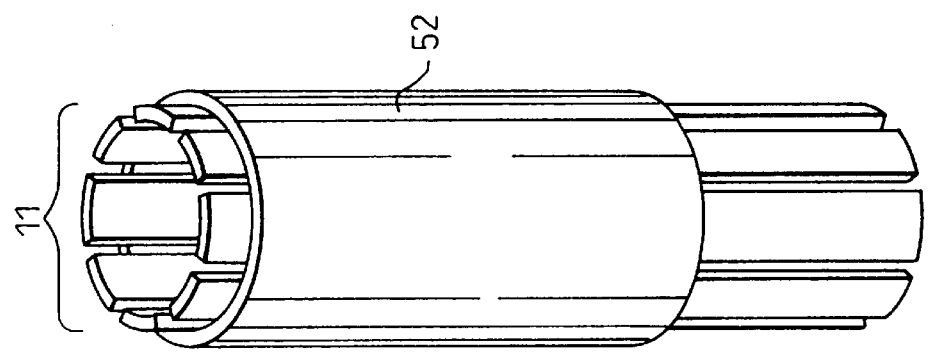
Figure 3A:
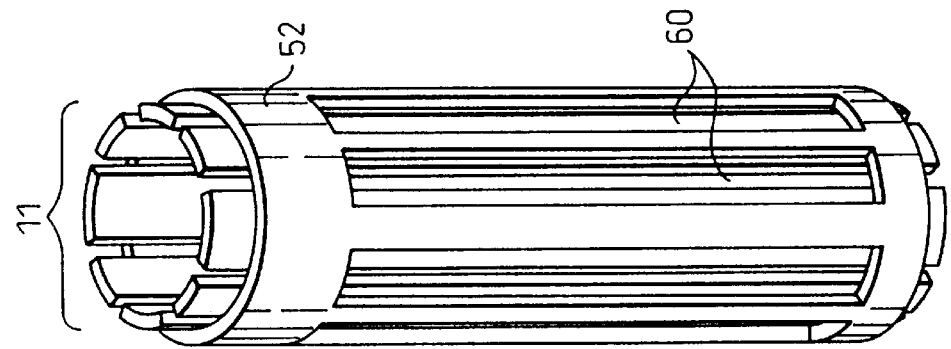
Figure 4:
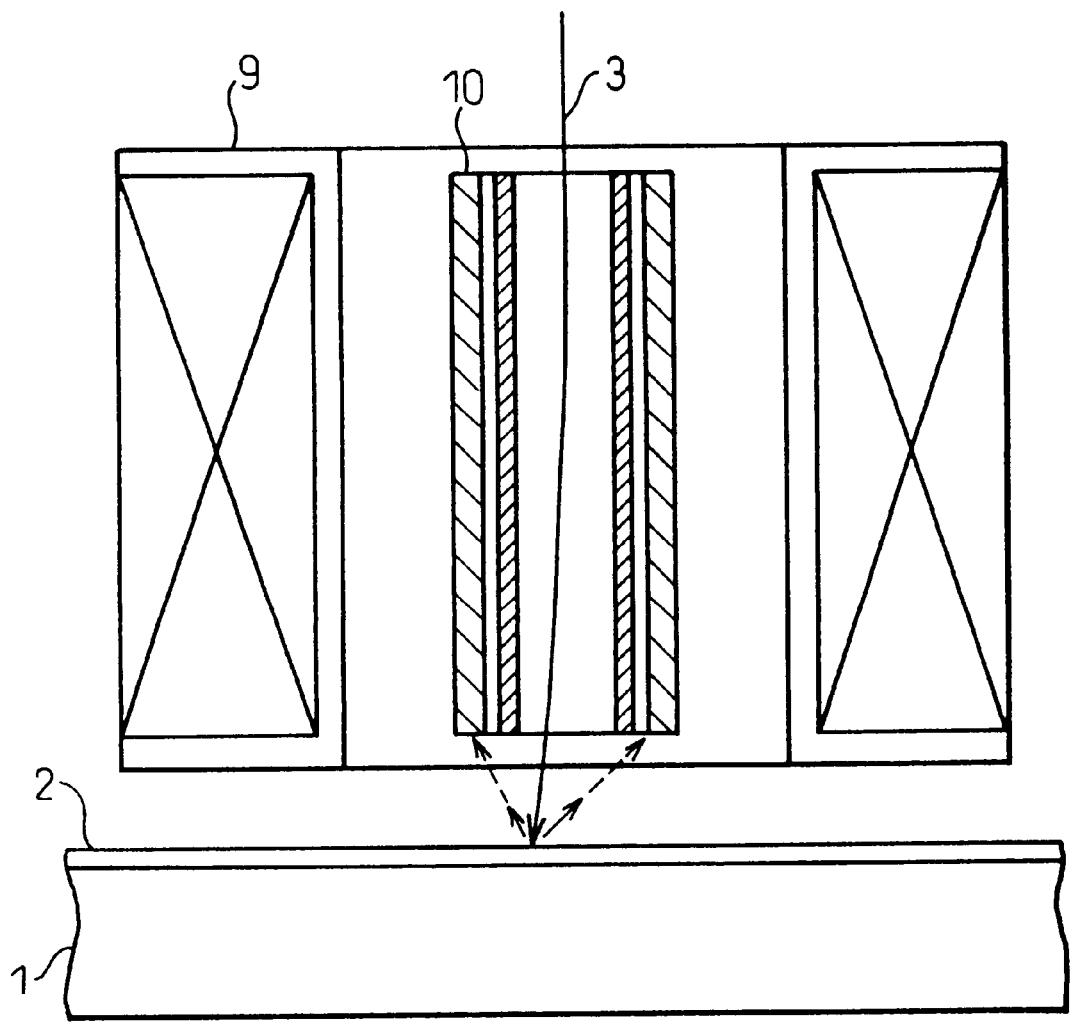
FIG. 4 is a diagram for explaining the charge-up and the attachment of contaminated substances at the portion nearer to the sample.

The electrostatic deflector according to this embodiment has the structure shown in FIGS. 1A to 1C and FIGS. 2A, 2B, and is different from the prior art only in that platinum is deposited by evaporation in vacuum on the inner wall surface of the electrode members $E_i$ after assembly. The assembled state of FIGS. 1A to 1C is obtained by the same steps as in the prior art. The only difference is the step of depositing platinum by evaporation in vacuum on the inner wall surface of the electrode members $E_i$.

Figure 5:
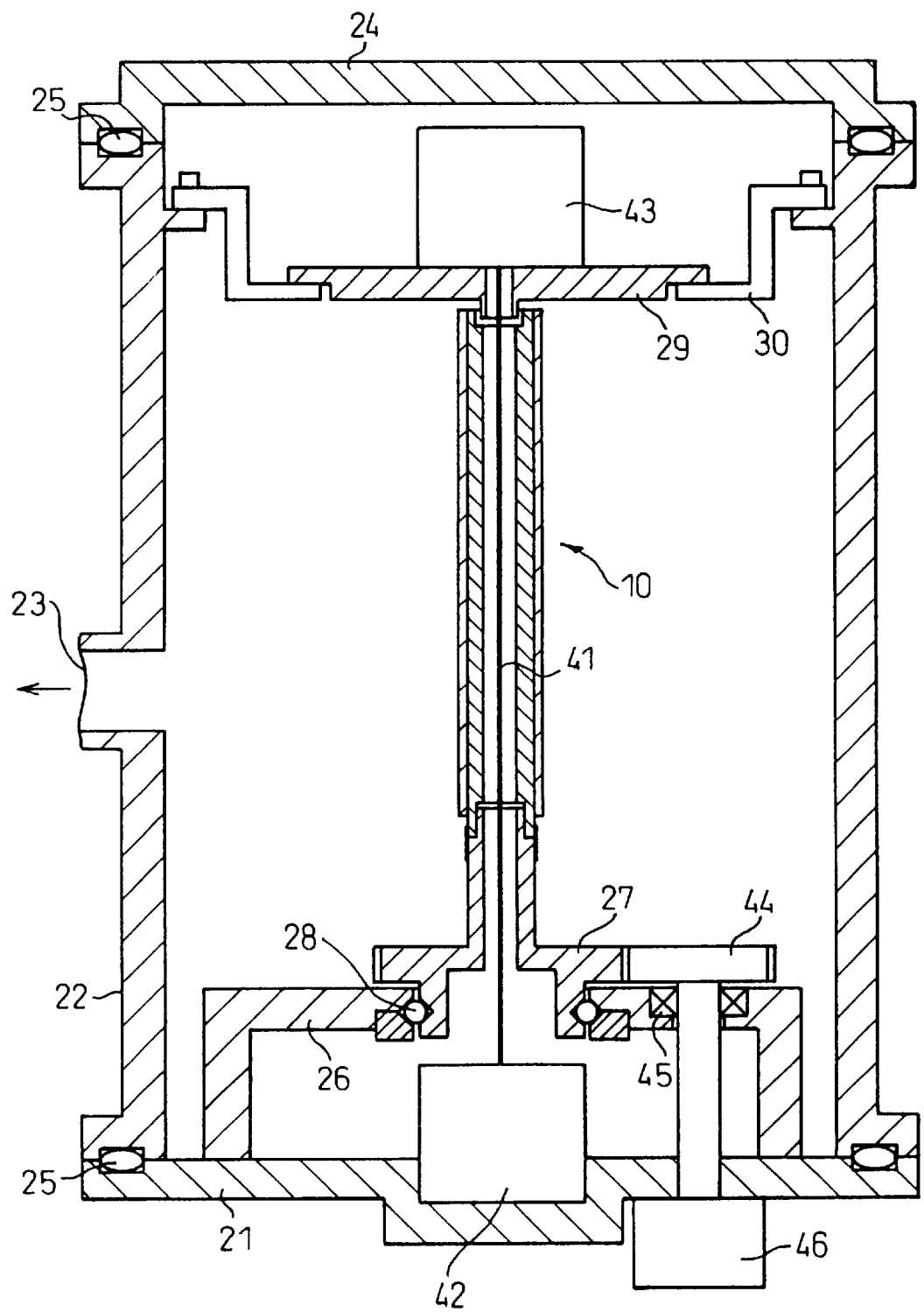
FIG. 5 is a sectional view of a vacuum vapor deposition apparatus used for vacuum vapor deposition of a metal thin film on the inner wall surface of the electrostatic deflector according to an embodiment.

FIG. 5 is a sectional view of a vapor deposition apparatus for depositing platinum by evaporation in vacuum on the inner wall surface of the electrode members $E_i$ of an electrostatic deflector according to an embodiment.

In FIG. 5, reference numeral 21 designates a base of the vapor deposition apparatus, on which a cylindrical side wall 22 is fixed through a packing 25. A path 23 connecting to a vacuum pump (not shown) is formed in the side wall 22. An upper plate 24 is mounted on the side wall 22 through another packing 25. Once the upper plate 24 is mounted and the vacuum pump is activated, the interior of the chamber partitioned by the base 21, the side wall 22 and the upper plate 24 is evacuated. The base 21 has a rotary base 26 thereon, on which a rotary table 27 is arranged through a bearing 28. The rotary table 27 is formed of gear teeth in mesh with a gear 44 rotated by a rotational motor 46. The rotary table 27 is rotated in accordance with the operation of the rotational motor. The forward end of the rotary table 27 is adapted to hold the electrostatic deflector 10. A rotation control member 29, which is mounted above the electrostatic deflector 10 thus held, is fixed on the side wall 22 through a mounting member 30. A platinum wire member 41 constituting a vapor deposition material is passed along the center axis of the electrostatic deflector 10 thus held. The lower portion of the wire member 41 is attached on a Z stage 42 constituting a vertical travel mechanism on the one hand and the upper portion thereof is attached to a Z stage 43. The Z stages 42, 43 are connected to a power supply not shown and can heat the wire member 41 by supplying a current thereto while at the same time moving the wire member 41 vertically.

The electrostatic deflector 10, assembled in the same manner as in the prior art, is held on the rotary table 27 with the upper plate 24 and the rotation control member 29 removed therefrom. After that, the rotation control member 29 is mounted, and the wire member 41 is inserted into the electrostatic deflector 10 and mounted on the Z stages 42, 43. Further, the upper plate 24 is fixed and the interior of the chamber is vacuumerized. While rotating the electrostatic deflector 10 by rotating the rotary table 27, the wire member 41 is heated by supplying a current thereto while moving it vertically. The platinum evaporated from the wire member 41 is deposited on the inner wall surface of the electrode members $E_i$ thereby to form a thin film. In the process, since the electrode members $E_i$ are crank-shaped, the platinum is not deposited on the inner wall surface of the holding member 12. Thus, the insulation between the electrode members $E_i$ is not adversely affected.

As described above, a platinum thin film is formed on the inner wall surface of the electrode members $E_i$. Even in the case where an undetectable fouling exists on the inner wall surface of the electrode members $E_i$, therefore, the platinum thin film formed on it prevents the inner wall surface of the electrode members $E_i$ from being charged up. Fouling may remain in portions not directly visible from the cylinder axis of the electrode members $E_i$, and the holding member 12 is insulative. Therefore, these portions may be charged up. However, because they are not in directly opposed relation to the interior of the cylinder, the electric field in the cylinder is not affected adversely.

It will thus be understood from the foregoing description that according to this invention, there is provided an electrostatic deflector in which the surface of the electrode member is not even slightly charged up by the fouling caused during assembly. Therefore, disturbance of the electric field of the electrostatic deflector is reduced and the accuracy of the exposure position is improved.

Figure 6:
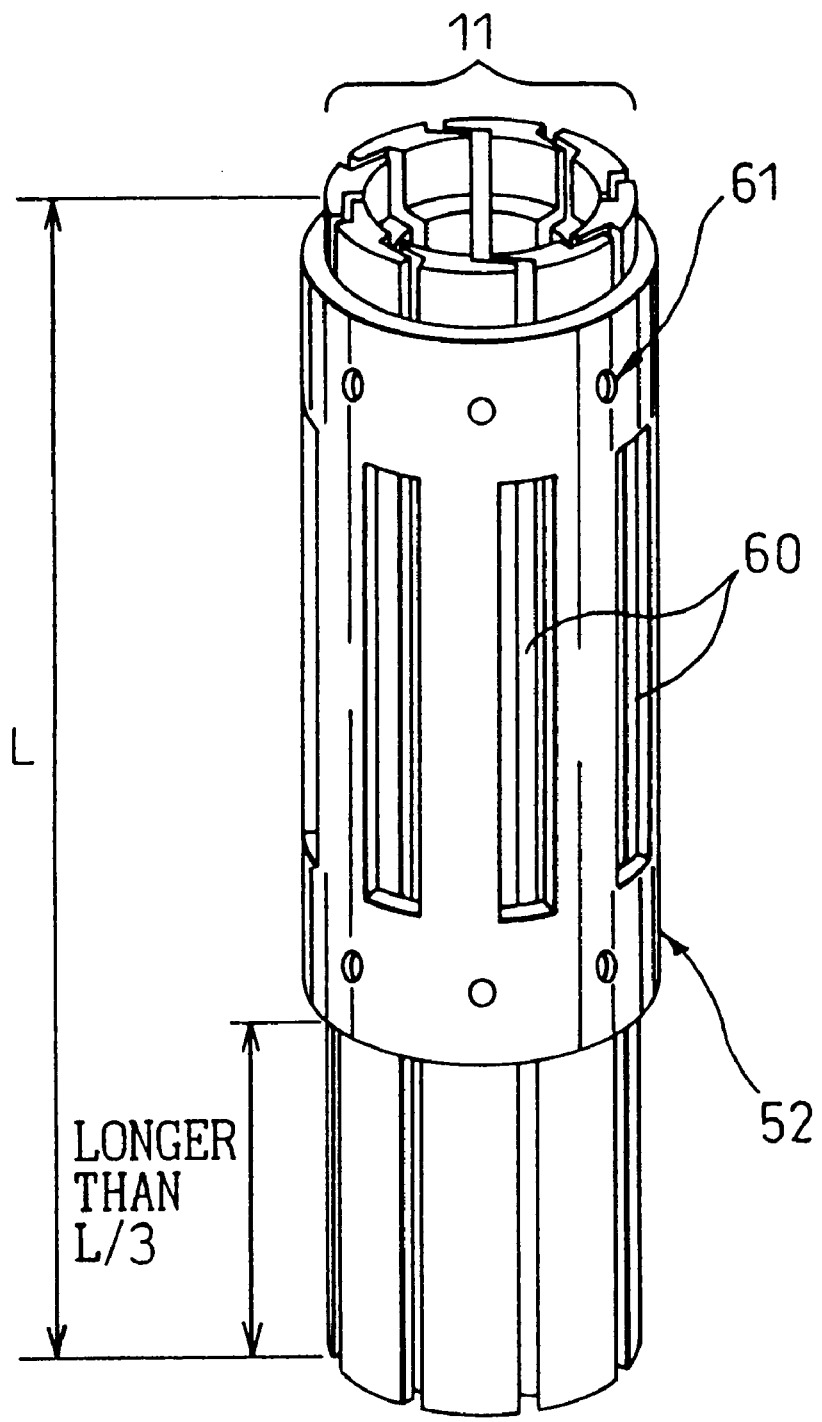
FIG. 6 is a perspective view showing a configuration of an electrostatic deflector according to a second embodiment of the invention.

FIG. 6 is a perspective view showing a configuration of an electrostatic deflector according to the second embodiment of the invention. The electrostatic deflector according to the second embodiment has a configuration of the first and second basic structures combined. In the electrostatic deflector according to the second embodiment, only the holding member 52 is different from the conventional one shown in FIG. 1, and the electrode group 11 configured of eight electrodes is the same as the conventional electrode group shown in FIG. 1. An assembling method will be explained with reference to FIG. 2.

At the time of assembly, each electrode member $E_i$, while being held in position accurately by an assembly jig, is inserted into the holding member 52. A small amount of soldering or brazing material 18 is injected into the holes 61 formed in the holding member 52 (FIG. 2B) and heated. As a result, the joining metal pads 14, 15 formed on the electrode members $E_i$ and the joining metal pads 16, 17 formed on the holding member are fixed to each other. In other words, the electrode members $E_i$ are firmly fixed in predetermined relative positions with the holding member 52.

In the same way as described above, the electrostatic deflector according to the second embodiment is realized.

Figure 7:
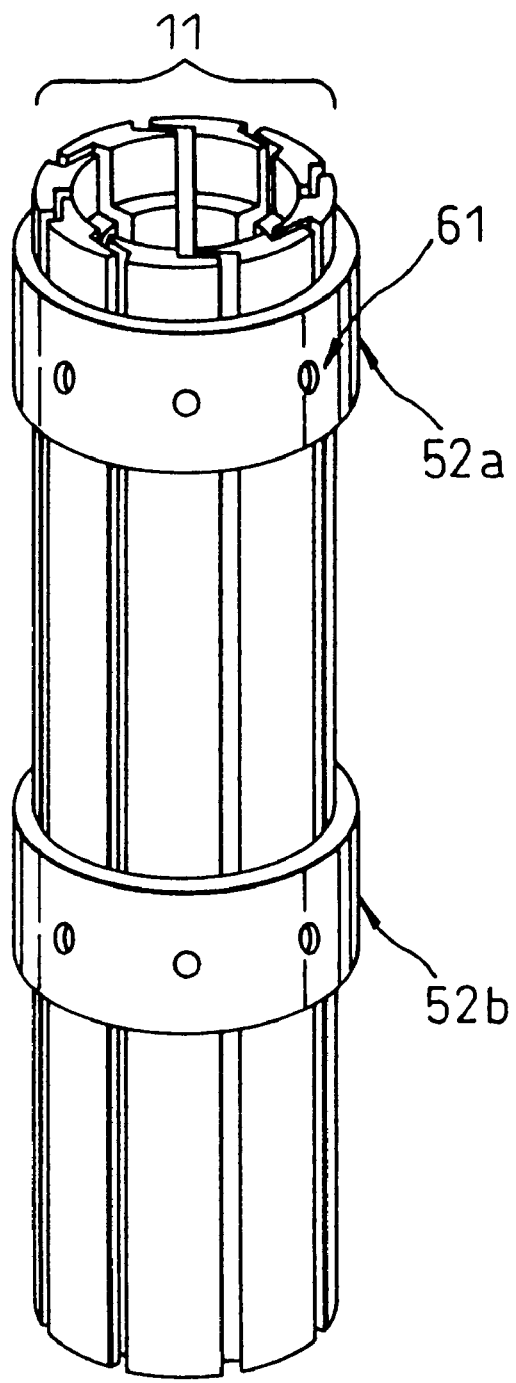
FIG. 7 is a perspective view showing a configuration of an electrostatic deflector according to a third embodiment of the invention.

FIG. 7 is a perspective view showing a configuration of an electrostatic deflector according to a third embodiment of the invention. As shown, in the electrostatic deflector according to the third embodiment, the holding member 52 is divided into two short holding units 52a, 52b. The holding units 52a, 52b each are a cylinder one tenth or less as long as the electrode member $E_i$, for example, and have eight holes 61 formed therein. The remaining structure of the holding members 52a, 52b is the same as the corresponding structure of the second embodiment. In other words, those portions of the holding member 52 of the electrostatic deflector according to the second embodiment shown in FIG. 6 which correspond to the length of the slots 60 are all removed, and the holding member 52 is divided into two portions. Thus, the lower holding unit 52b is located at a distance at least one third of the electrode length away from the lower end of the electrode group 11.

The electrostatic deflector according to the third embodiment has the holding member thereof divided into the two holding units 52a, 52b, and therefore are not assembled in the same manner as that of the second embodiment. This electrostatic deflector is assembled into a fixed state by injecting the soldering or brazing material into the holes 61 with the eight electrode members $E_i$ and the two holding units 52a, 52b fixed exactly in position using an assembly jig.

As described above, with the electrostatic deflector according to this invention, the charge-up of and the attachment of contaminated substances to the holding member for holding the electrodes are reduced and so is the disturbance of the electric field of the electrostatic deflector, thereby improving the accuracy of the exposure position.

What is claimed is:

1. An electrostatic deflector of an electron beam radiation apparatus, comprising a cylindrical holding member made of a non-conductive material and a plurality of electrodes having at least a partially conductive surface separated fixedly from each other along an inner peripheral direction of said holding member, wherein said holding member has a plurality of elongated slots radially extending through said holding member, each of said elongated slots extending in the direction parallel to the axis of said cylinder in the portions thereof facing the space between adjoining ones of said electrodes, thereby reducing an area of said portions on which charge can accumulate so as to reduce an effect of such accumulated charge on an electric field in the electrostatic deflector.

2. An electrostatic deflector of an electron beam radiation apparatus according to claim 1, wherein a plurality of said electrodes extend in the direction of electron beam emission from said holding member.

3. An electrostatic deflector of an electron beam radiation apparatus according to claim 2, wherein the length of extension of a plurality of said electrodes in the direction of electron beam emission from said holding member is longer than one third of the length of said electrode.

4. An electrostatic deflector of an electron beam radiation apparatus according to claim 1, wherein said holding member comprises a tubular wall, and the elongated slots extend through the tubular wall from inside to outside thereof.

5. An electrostatic deflector of an electron beam radiation apparatus, comprising a cylindrical holding member made of a non-conductive material and a plurality of electrodes having at a least partially conductive surface separated fixedly from each other along the inner peripheral direction of said holding member, wherein a plurality of said electrodes extend in the direction of electron beam emission from said holding member; and wherein the length of extension of a plurality of said electrodes in the direction of electron beam emission from said holding member is longer than one third of the length of said electrode.

6. An electrostatic deflector of an electron beam radiation apparatus, comprising a cylindrical holding member made of a non-conductive material and a plurality of electrodes having at least a partially conductive surface separated fixedly from each other along the inner peripheral direction of said holding member, wherein said holding member has a plurality of independent holding units; and wherein the total length of said holding units is less than half the length of said electrodes, thereby reducing an area of the holding member on which charge can accumulate so as to reduce an effect of such accumulated charge on an electric field in the electrostatic deflector.

7. An electrostatic deflector of an electron beam radiation apparatus according to claim 6, wherein the distance from the end of the holding unit nearest to the sample along the direction of electron beam emission to the end of the electrodes along the direction of electron beam emission is longer than one third of the length of said electrodes.

8. An electrostatic deflector of an electron beam radiation apparatus according to claim 6, wherein said holding member includes a plurality of wedge-shaped fixing holes having a larger diameter on the outer peripheral surface of said holding member than on the inner peripheral surface thereof and arranged at positions corresponding to a plurality of said electrodes fixed, respectively, said electrodes being fixed on said holding member by injecting a molten joining metal into said fixing holes with the electrodes appropriately arranged on said holding member and setting said joining metal in close contact with the metal films of said electrodes;

wherein said electrodes, as fixed on said holding member, are so shaped that the inner wall surface of said holding member is invisible from the cylinder axis of said holding member; and wherein said electrodes have a metal thin film formed by vapor deposition on the inner wall surface thereof after being fixed on said holding member.

* * * * *